(12) United States Patent
Yang et al.

(10) Patent No.: US 12,009,653 B2
(45) Date of Patent: Jun. 11, 2024

(54) CONTACTOR CONTROL APPARATUS AND POWER SUPPLY SYSTEM

(71) Applicant: Huawei Digital Power Technologies Co., Ltd., Shenzhen (CN)

(72) Inventors: Yanxing Yang, Dongguan (CN); Haibo Long, Dongguan (CN); Zehua Liang, Dongguan (CN); Wei Guo, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 445 days.

(21) Appl. No.: 17/384,410

(22) Filed: Jul. 23, 2021

(65) Prior Publication Data

US 2021/0351581 A1    Nov. 11, 2021

Related U.S. Application Data

(63) Continuation of application No. PCT/CN2020/114088, filed on Sep. 8, 2020.

(30) Foreign Application Priority Data

Nov. 14, 2019  (CN) .......................... 201911114789.2

(51) Int. Cl.
*H02H 3/08* (2006.01)
*G01R 33/07* (2006.01)
(Continued)

(52) U.S. Cl.
CPC .............. *H02H 3/08* (2013.01); *H02H 3/021* (2013.01); *H02H 3/05* (2013.01); *G01R 33/07* (2013.01); *G01R 33/093* (2013.01); *G01R 33/098* (2013.01)

(58) Field of Classification Search
CPC ............ H02H 3/08; H02H 3/021; H02H 3/05; H02H 3/006; G01R 33/07; G01R 33/093; G01R 33/098
(Continued)

(56) References Cited

U.S. PATENT DOCUMENTS 5,774,319 A    6/1998  Carter et al.
6,008,973 A    12/1999 Dunne et al.
(Continued)

FOREIGN PATENT DOCUMENTS

CN    101673926 A    3/2010
CN    102368603 A    3/2012
(Continued)

OTHER PUBLICATIONS

FR 2880984; Boudet: Current switching device circuit breaker for resistive load, has control circuit activating electronic current limiter to obtain current having value lower than or equal to threshold value, during switchign of current switches; drawings, specification, (Year: 2006).*

*Primary Examiner* — Dharti H Patel
(74) *Attorney, Agent, or Firm* — Leydig, Voit & Mayer, Ltd.

(57) ABSTRACT

The control apparatus includes an electrical signal detection unit, a control unit, a contactor, a first execution unit, a protection unit, and a second execution unit. The electrical signal detection unit detects an electrical signal on a loop, and send the electrical signal to the control unit. The control unit generates a control signal, and send the control signal to the first execution unit. The contactor is connected to the loop. The first execution unit controls the contactor to be closed or opened, where when the contactor is closed, the loop is connected, and when the contactor is opened, the loop is disconnected. The protection unit detects a current value on the loop when the contactor is closed, where an (Continued)

opening instruction is sent to the second execution unit when the current value reaches a trip threshold. The second execution unit opens the contactor when receiving the opening instruction.

10 Claims, 4 Drawing Sheets

(51) Int. Cl.
  *G01R 33/09* (2006.01)
  *H02H 3/02* (2006.01)
  *H02H 3/05* (2006.01)
(58) Field of Classification Search
  USPC ........................................ 361/93.1
  See application file for complete search history.

(56) References Cited

U.S. PATENT DOCUMENTS

| | | | | |
|---|---|---|---|---|
| 8,068,937 | B2* | 11/2011 | Eaves | H02H 3/30 307/62 |
| 8,587,243 | B2* | 11/2013 | Sakane | B60L 15/16 318/434 |
| 11,652,400 | B2* | 5/2023 | Garbossa | H02M 1/32 361/18 |
| 11,791,081 | B2* | 10/2023 | Seon | H01H 1/54 361/152 |
| 2011/0222200 | A1* | 9/2011 | Fuller | H01H 9/548 361/100 |
| 2011/0299201 | A1* | 12/2011 | Rozman | H02H 1/0015 361/42 |
| 2011/0317321 | A1* | 12/2011 | Vogel | H02H 3/025 361/87 |
| 2012/0002391 | A1* | 1/2012 | Van Weelden | H02H 3/04 361/811 |
| 2012/0075759 | A1* | 3/2012 | Eaves | H02H 3/44 361/86 |
| 2015/0015999 | A1* | 1/2015 | Relyea | H02H 3/04 361/115 |
| 2016/0072269 | A1* | 3/2016 | Esschendal | H02H 7/268 361/62 |
| 2019/0109451 | A1 | 4/2019 | Takemura et al. | |

FOREIGN PATENT DOCUMENTS

| | | |
|---|---|---|
| CN | 102522272 A | 6/2012 |
| CN | 104253407 A | 12/2014 |
| CN | 104321942 A | 1/2015 |
| CN | 104600847 A | 5/2015 |
| CN | 105680412 A | 6/2016 |
| CN | 207818468 U | 9/2018 |
| CN | 207853441 U | 9/2018 |
| CN | 208753245 U | 4/2019 |
| CN | 110970866 A | 4/2020 |

* cited by examiner

CONTACTOR CONTROL APPARATUS AND POWER SUPPLY SYSTEM

CROSS-REFERENCE OF RELATED APPLICATIONS

This application is a continuation of International Application No. PCT/CN2020/114088, filed on Sep. 8, 2020, which claims priority to Chinese Patent Application No. 201911114789.2, filed on Nov. 14, 2019. The disclosures of the aforementioned applications are hereby incorporated by reference in their entireties.

TECHNICAL FIELD

This application relates to the field of electric technologies, and in particular, to a contactor control apparatus and a power supply system.

BACKGROUND

A contactor is a device that can quickly cut off an alternating-current or direct-current loop, and is an important element in an automatic control system.

In a conventional technology, based on a current value detected in real time by a current transformer, a control unit is used to directly control the contactor to perform an opening or closing operation, thereby protecting a loop. Although the existing contactor with intelligent closing and opening has a loop control function and implements automation to some extent, the loop cannot be protected once the control unit is faulty.

Therefore, the contactor provided in the conventional technology has a problem that the loop cannot be protected when the control unit is faulty.

SUMMARY

This application provides a contactor control apparatus and a power supply system, to protect a loop when a control unit of a contactor is faulty.

According to a first aspect, an embodiment of this application provides a contactor control apparatus. The contactor control apparatus includes an electrical signal detection unit, a control unit, a first execution unit, a contactor, a protection unit, and a second execution unit. The electrical signal detection unit is configured to: detect an electrical signal on a loop, and send the detected electrical signal to the control unit. The control unit is configured to: generate a control signal based on the received electrical signal, and send the control signal to the first execution unit. The contactor is connected to the loop. The first execution unit is configured to control the contactor to be closed or opened based on the received control signal. When the contactor is closed, the loop is connected, and when the contactor is opened, the loop is disconnected. The protection unit is configured to detect a current value on the loop when the contactor is closed, where an opening instruction is sent to the second execution unit when the current value reaches a trip threshold. The second execution unit is configured to open the contactor when receiving the opening instruction.

The contactor control apparatus provided in the first aspect is used. When the control unit is not faulty, and the contactor is in a closing state, the loop is connected, and the control unit may control the first execution unit to perform an opening or closing operation on the contactor based on a loop electrical signal detected by the electrical signal detection unit, to control the loop and protect the loop. When the control unit is faulty and the contactor is in the closing state, if the loop is faulty, for example, the loop is overload or suffers a short circuit, the protection unit may control the second execution unit to open the contactor to disconnect the loop, thereby protecting the loop. Therefore, regardless of whether the control unit is faulty, the contactor control apparatus can protect the loop. In conclusion, the contactor control apparatus provided in this embodiment of this application can be used to protect the loop regardless of whether the control unit is faulty, thereby implementing double protection for the loop.

In a possible design, the second execution unit may include a first diode, a second diode, a third switch tube, a capacitor, a first switch, and a second switch. An anode of the first diode is connected to a positive electrode of a power supply of the contactor, and a cathode of the first diode is connected to a first terminal of the capacitor. An anode of the second diode is connected to a second terminal of the capacitor, and a cathode of the second diode is connected to a negative electrode of the power supply of the contactor. An anode of the third diode is connected to the second terminal of the capacitor, and a cathode of the third diode is connected to the protection unit. The first switch is connected between the first terminal of the capacitor and a negative wiring terminal of the contactor. The second switch is connected between the second terminal of the capacitor and a positive wiring terminal of the contactor.

The contactor control apparatus provided in the first aspect is used. When the first switch and the second switch are disconnected, the contactor is not connected to the second execution unit. When the current value on the loop is greater than the trip threshold and when the first switch and the second switch are closed, the positive wiring terminal of the contactor is connected to a negative electrode of the capacitor, and the negative wiring terminal of the contactor is connected to a positive electrode of the capacitor. Therefore, the wiring terminals of the contactor are connected to a reverse voltage, and the contactor is opened to disconnect the loop, thereby protecting the loop.

In a possible design, the protection unit may include an overload protection module and a short circuit protection module. The overload protection module is connected to the loop, and is configured to: detect the current value on the loop when the contactor is closed, and trigger the first switch and the second switch to be closed when the current value reaches a first trip threshold. The short circuit protection module is connected to the loop, and is configured to: detect the current value on the loop when the contactor is closed, and trigger the first switch and the second switch to be closed when the current value reaches a second trip threshold. The first trip threshold is less than the second trip threshold.

The contactor control apparatus provided in the first aspect is used. When the loop suffers different types of faults (an overload fault and a short circuit fault), currents flowing through the loop are different. Therefore, different trip thresholds may be set for the short circuit protection module and the overload protection module, so that the contactor can be opened to disconnect the loop when the loop suffers different faults, thereby protecting safety of the loop. Moreover, the control unit is not required in a protection process. In conclusion, when the control unit is faulty, the contactor control apparatus provided in the first aspect can be used to protect the loop from a plurality of different faults under control the protection unit.

In a possible design, the overload protection module may include a thermal tripper, and the short circuit protection module includes an instantaneous tripper.

According to the foregoing solution, the loop can be protected from the overload fault and the short circuit fault under control of the thermal tripper and the instantaneous tripper.

In a possible design, the first execution unit includes a fourth diode, a fifth diode, a first relay, and a second relay. An anode of the fourth diode is connected to the control unit and a negative wiring terminal of the second relay, and a cathode of the fourth diode is connected to a positive wiring terminal of the first relay. An anode of the fifth diode is connected to the control unit and a negative wiring terminal of the first relay, and a cathode of the fifth diode is connected to a positive wiring terminal of the second relay. A first terminal of a first main contact of the first relay is connected to the positive electrode of the power supply of the contactor, and a second terminal of the first main contact of the first relay is connected to the positive wiring terminal of the contactor. A first terminal of a second main contact of the first relay is connected to a first terminal of a second main contact of the second relay, and a second terminal of the second main contact of the first relay is connected to the negative wiring terminal of the contactor and the negative electrode of the power supply of the contactor. A first terminal of a first main contact of the second relay is connected to the positive electrode of the power supply of the contactor, and a second terminal of the first main contact of the second relay is connected to the negative wiring terminal of the contactor. A second terminal of the second main contact of the second relay is connected to both the positive wiring terminal of the contactor and the negative electrode of the power supply of the contactor.

The contactor control apparatus provided in the first aspect is used. The first relay and the second relay are both connected to the control unit. By controlling a magnitude of the control signal output by the control unit, the main contacts of the first relay and the main contacts of the second relay are controlled to be connected or disconnected, to control a connection between the contactor and the power supply, thereby controlling the contactor to be opened or closed, and controlling and protecting the loop. In conclusion, under control of the first execution unit, the contactor can control or protect the loop.

In a possible design, the contactor control apparatus provided in this embodiment of the present disclosure may further include a manual control unit, configured to control the contactor to be opened or closed under operation of a user. In this way, when the control unit is faulty, the loop can be connected and disconnected by using the manual control unit under operation control of the user, thereby protecting the loop more flexibly.

In a possible design, the manual control unit may include a sixth diode, a seventh diode, a third switch, a fourth switch, a fifth switch, and a sixth switch. An anode of the sixth diode is connected to the positive electrode of the power supply of the contactor, and a cathode of the sixth diode is connected to both a first terminal of the third switch and a first terminal of the fifth switch. An anode of the seventh diode is connected to the negative electrode of the power supply of the contactor, and a cathode of the seventh diode is connected to both a first terminal of the fourth switch and a first terminal of the sixth switch. A second terminal of the third switch is connected to the positive wiring terminal of the contactor. A second terminal of the fourth switch is connected to the negative wiring terminal of the contactor. A second terminal of the fifth switch is connected to the negative wiring terminal of the contactor. A second terminal of the sixth switch is connected to the positive wiring terminal of the contactor.

The contactor control apparatus provided in the first aspect is used. The third switch and the fourth switch are closed, to implement the connection between the contactor and the power supply, and the wiring terminals of the contactor are connected to a forward voltage, to close the contactor. The fifth switch and the sixth switch are closed, to implement the connection between the contactor and the power supply, and the wiring terminals of the contactor are connected to a reverse voltage, to open the contactor.

In a possible design, the third switch, the fourth switch, the fifth switch, or the sixth switch may be an inching switch; or the third switch and the fourth switch constitute a first linked switch, and the fifth switch and the sixth switch constitute a second linked switch.

In a possible design, the electrical signal detection unit may be any one or more of the following: a Hall effect sensor, a magnetic sensor, a giant magneto resistive GMR magnetic field sensor, a tunnel magneto resistive TMR sensor, a magneto resistive AMR sensor, and a current divider.

In a possible design, the contactor control apparatus provided in the first aspect may further include an arc-extinguishing apparatus, configured to extinguish an electric arc generated when a status of the contactor changes. That a status of the contactor changes includes that the contactor changes from a closing state to an opening state or changes from an opening state to a closing state. Based on this, the contactor control apparatus provided in the first aspect is used, so that the electric arc can be extinguished under control of the arc-extinguishing apparatus.

According to a second aspect, an embodiment of this application provides a power supply system. The power supply system includes an alternating-current power supply, an electricity consumption apparatus, and the contactor control apparatus provided in any one of the first aspect or the possible designs of the first aspect. The contactor control apparatus is configured to control a connection between the alternating-current power supply and the electricity consumption apparatus.

In addition, for technical effects brought by any possible design manner in the second aspect, refer to technical effects brought by different design manners in the first aspect. Details are not described herein again.

DESCRIPTION OF EMBODIMENTS

To make the objectives, technical solutions, and advantages of this application clearer, the following further describes this application in detail with reference to the accompanying drawings.

Currently, contactors are mostly used in power supply systems. A contactor is connected to a path (loop) between an alternating-current power supply and an electricity consumption device. A connection between the alternating-current power supply and the electricity consumption device is controlled based on a voltage on two wiring terminals of the contactor, to control, based on a low current or a low voltage, a loop through which a high current flows to be connected or disconnected.

Figure 1:
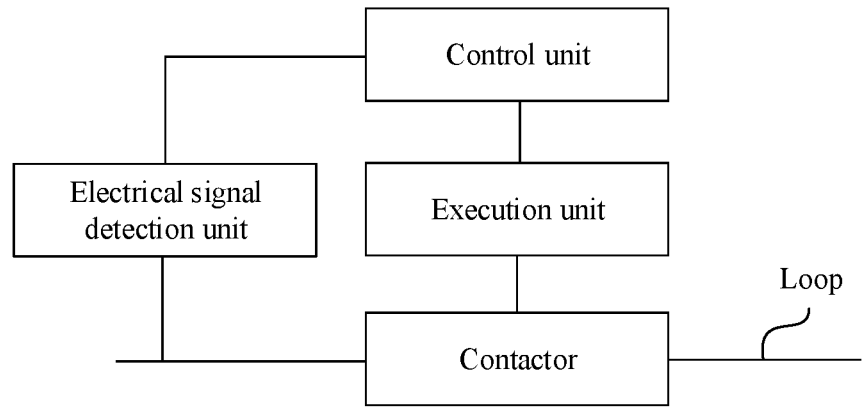
FIG. 1 is a schematic structural diagram of a contactor control apparatus provided in a conventional technology.

In a conventional technology, a possible structure of a contactor control apparatus may be shown in FIG. 1. The contactor control apparatus shown in FIG. 1 includes a control unit, a contactor, an execution unit, and an electrical signal detection unit. Specifically, the control unit controls the execution unit to close or open the contactor, thereby controlling the loop to be connected or disconnected. When the contactor is in a closing state, the electrical signal detection unit detects a current on the loop in real time. The control unit determines that the loop is faulty (short circuit or overload) when determining that the current on the loop exceeds a fault threshold. The control unit is notified of controlling the execution unit to open the contactor to disconnect the loop, thereby protecting the loop. Although the contactor control apparatus shown in FIG. 1 can control the loop to be connected or disconnected, and protect safety of the loop, to protect the loop, it needs to be ensured that the control unit is not faulty. Once the control unit is faulty, the loop cannot be protected. Therefore, the contactor control apparatus in the conventional technology has a problem that the loop cannot be protected when the control unit is faulty.

To resolve the foregoing technical problem, the embodiments of this application provide a contactor control apparatus, configured to protect a loop when a control unit is faulty.

In specific descriptions of the following embodiments, it should be noted that "a plurality of" in this application refers to two or more. The term "or" in this application describes an association relationship for describing associated objects and represents that three relationships may exist. For example, A or B may represent the following three cases: Only A exists, both A and B exist, and only B exists. A connection in this application describes a connection relationship between two objects, and may represent two connection relationships. For example, a connection between A and B may represent two cases: A is directly connected to B, and A is connected to B through C. In addition, it needs to be understood that, in the descriptions of this application, terms such as "first", "second", and "third" are used only for purposes of distinguishing descriptions, and cannot be understood as indicating or implying relative importance, or as indicating or implying a sequence.

Figure 2:
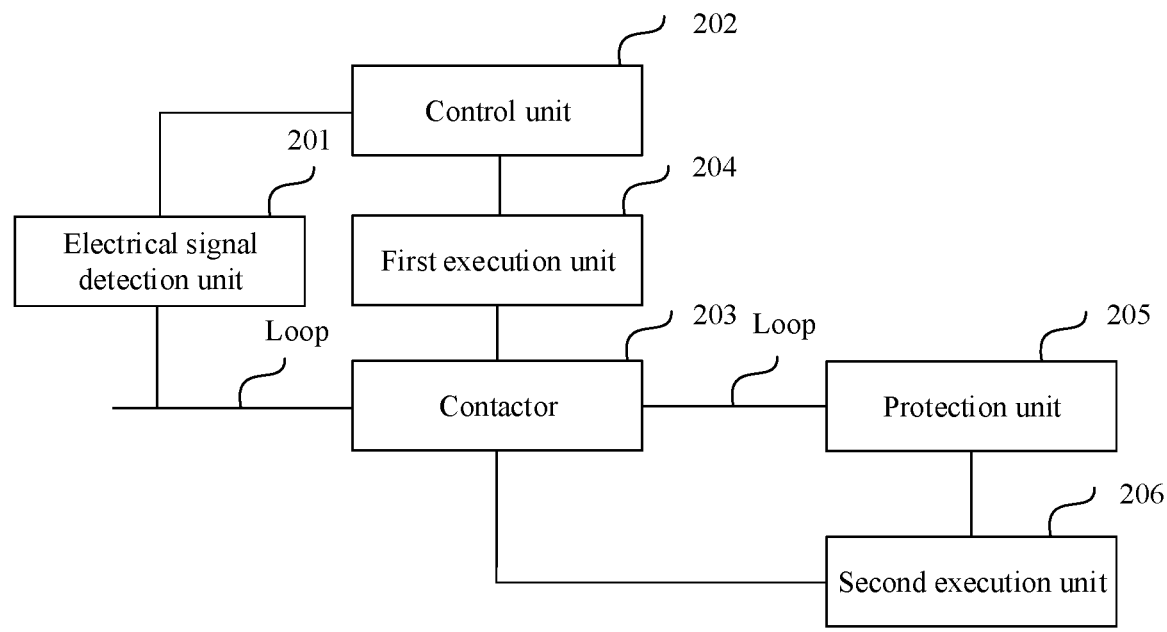
FIG. 2 is a first schematic structural diagram of a contactor control apparatus according to an embodiment of this application.

FIG. 2 is a schematic structural diagram of a contactor control apparatus according to an embodiment of this application. The contactor control apparatus 200 includes an electrical signal detection unit 201, a control unit 202, a contactor 203, a first execution unit 204, a protection unit 205, and a second execution unit 206.

The electrical signal detection unit 201 is configured to: detect an electrical signal on a loop, and send the detected electrical signal to the control unit 202. The control unit 202 is configured to: generate a control signal based on the received electrical signal, and send the control signal to the first execution unit 204. The contactor 203 is connected to the loop. The first execution unit 204 is configured to control the contactor 203 to be closed or opened based on the received control signal, where when the contactor 203 is closed, the loop is connected, and when the contactor 203 is opened, the loop is disconnected. The protection unit 205 is configured to detect a current value on the loop when the contactor 203 is closed, where an opening instruction is sent to the second execution unit 206 when the current value reaches a trip threshold. The second execution unit 206 is configured to open the contactor 203 when receiving the opening instruction. The electrical signal may include a current.

When the control unit 202 is configured to protect safety of the loop, one end of the electrical signal detection unit 201 is connected to the loop, and the other end of the electrical signal detection unit 201 is connected to the control unit 202. One end of the first execution unit 204 is connected to the control unit 202, and the other end of the first execution unit 204 is connected to the contactor 203. When the loop is connected, the electrical signal detection unit 201 may detect the current on the loop in real time or periodically, and when determining that the current on the loop exceeds a normal working current, trigger the control unit 202 to send the control signal to the first execution unit 204, to control the first execution unit 204 to open the contactor 203 to disconnect the loop, thereby protecting safety of the loop. The electrical signal detection unit 201 may be any one of a Hall effect sensor, a magnetic sensor, a giant magneto resistive GMR magnetic field sensor, a tunnel magneto resistive TMR sensor, a magneto resistive AMR sensor, and a current divider.

Specifically, when the loop is connected and normally works, the current on the loop is stabilized in a fixed current fluctuation interval. When the current value on the loop exceeds the current fluctuation interval, it may be determined that the loop is faulty. The fixed current fluctuation interval may be stored in the control unit 202. When it is determined that the received loop current value sent by the electrical signal detection unit 201 exceeds a value of the current fluctuation interval, the control signal is sent to the first execution unit 204, to control the contactor 203 to be opened to disconnect the loop, thereby protecting safety of the loop. For example, when the loop is connected, the contactor 203 maintains a closing state or switches from the closing state to an opening state, and this may be implemented by adjusting the value of the current fluctuation interval.

During specific implementation, the control unit 202 may be any one of a micro control unit MCU), a central processing unit, and a digital signal processor DSP). Certainly, a specific form of the control unit 202 is not limited to the foregoing examples. This is not limited herein in this application.

When the protection unit 205 is configured to protect safety of the loop, one end of the protection unit 205 is connected to the loop, and the other end of the protection unit 205 is connected to one end of the second execution unit 206. The other end of the second execution unit 206 is connected to the contactor 203. When the loop is connected, the protection unit 205 detects the current value on the loop. When the current value on the loop reaches the trip threshold, an opening instruction is sent to the second execution unit 206, and the second execution unit 206 controls the contactor 203 to be opened to disconnect the loop, thereby protecting safety of the loop.

It should be understood that, when the loop suffers different faults (a short circuit fault or an overload fault), currents flowing through the loop are different. To protect the loop from a plurality of faults on the loop, a short circuit protection module and an overload protection module are disposed on the protection unit 205. The loop may be protected from a plurality of faults by setting different trip thresholds for the short circuit protection module and the overload protection module.

Specifically, the overload protection module is connected to the loop, and is configured to: detect the current value on the loop when the contactor 203 is closed, and trigger the second execution unit 206 to open the contactor 203 when the current value reaches a first trip threshold. The short circuit protection module is connected to the loop, and is configured to: detect the current value on the loop when the contactor 203 is closed, and trigger the second execution unit 206 to open the contactor 203 when the current value reaches a second trip threshold. The first trip threshold is less than the second trip threshold. The overload protection module may be a thermal tripper, and the short circuit protection module may be an instantaneous tripper. The overload protection module may be connected in series to the short circuit protection module.

During actual application, when the contactor 203 switches from the closing state to the opening state, or switches from the opening state to the closing state, an electric arc is generated on the contactor 203. When the current on the loop is relatively large, the generated electric arc may damage the device and endanger surrounding people. Therefore, to ensure safety of the device and safety of surrounding people, an arc-extinguishing apparatus 703 may be further disposed on the contactor control apparatus 200, to extinguish the electric arc generated on the contactor 203 (see FIG. 7). The arc-extinguishing apparatus 703 may be a magnetic blowout arc-extinguishing apparatus or an arc splitter arc-extinguishing apparatus.

The following describes specific structures of the first execution unit 204 and the second execution unit 206 in the contactor control apparatus 200.

1. First Execution Unit 204

The first execution unit 204 may include a fourth diode, a fifth diode, a first relay, and a second relay.

Specifically, an anode of the fourth diode is connected to the control unit and a negative wiring terminal of the second relay, and a cathode of the fourth diode is connected to a positive wiring terminal of the first relay; an anode of the fifth diode is connected to the control unit and a negative wiring terminal of the first relay, and a cathode of the fifth diode is connected to a positive wiring terminal of the second relay; a first terminal of a first main contact of the first relay is connected to the positive electrode of the power supply of the contactor, and a second terminal of the first main contact of the first relay is connected to the positive wiring terminal of the contactor; a first terminal of a second main contact of the first relay is connected to a first terminal of a second main contact of the second relay, and a second terminal of the second main contact of the first relay is connected to the negative wiring terminal of the contactor and the negative electrode of the power supply of the contactor; a first terminal of a first main contact of the second relay is connected to the positive electrode of the power supply of the contactor, and a second terminal of the first main contact of the second relay is connected to the negative wiring terminal of the contactor; and a second terminal of the second main contact of the second relay is connected to both the positive wiring terminal of the contactor and the negative electrode of the power supply of the contactor.

The first relay and the second relay are disposed for the following function: When the first relay is conducted, the two wiring terminals of the contactor 203 are connected to a forward voltage through closing of the first main contact and the second main contact of the first relay, and the contactor 203 is closed. When the second relay is conducted, the two wiring terminals of the contactor 203 are connected to a reverse voltage through closing of the first main contact and the second main contact of the second relay, and the contactor 203 is opened, to control the loop.

The fourth diode and the fifth diode are disposed for the following function: Only either of the first relay and the second relay is conducted at a same moment, to prevent the device from being damaged by a short circuit of the power supply due to simultaneous conduction of the first relay and the second relay.

Figure 3:
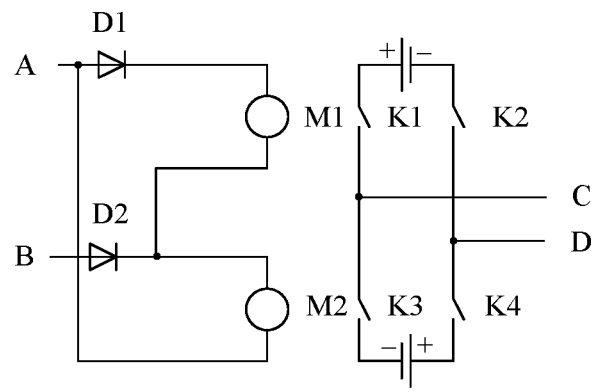
FIG. 3 is a schematic structural diagram of a first execution unit according to an embodiment of this application.

For ease of understanding, the following provides a specific example of the structure of the first execution unit 204. FIG. 3 is a schematic structural diagram of a first execution unit 204 according to an embodiment of this application. In FIG. 3, D1 may be considered as the fourth diode, D2 may be considered as the fifth diode, M1 may be considered as a coil of the first relay, M2 may be considered as a coil of the second relay, K1 is the first main contact of the first relay, K2 is the second main contact of the first relay, K3 is the first main contact of the second relay, K4 is the second main contact of the second relay, the first relay includes M1, K1, and K2, and the second relay includes M2, K3, and K4.

When the contactor 203 is closed by using the first execution unit 204 shown in FIGS. 3, A and B are used as input ends, configured to receive a control signal, and C and D are used as output ends, and are respectively connected to the positive wiring terminal and the negative wiring terminal of the contactor 203. When A receives the control signal (a high-level signal), the coil M1 is powered on, and K1 and K2 are closed. In this case, the positive electrode of the power supply is connected to the positive wiring terminal of the contactor 203 through C, and the negative electrode of the power supply is connected to the negative wiring terminal of the contactor 203 through D. The contactor 203 is connected to a forward unit, and the contactor 203 is closed to connect the loop.

When the contactor 203 is opened by using the first execution unit 204 shown in FIGS. 3, A and B are used as input ends, configured to receive a control signal, and C and D are used as output ends, and are respectively connected to the positive wiring terminal and the negative wiring terminal of the contactor 203. When B receives the control signal (a high-level signal), the coil M2 is powered on, and K3 and K4 are closed. In this case, the positive electrode of the power supply is connected to the negative wiring terminal of the contactor 203 through D, and the negative electrode of the power supply is connected to the positive wiring terminal of the contactor 203 through C. The contactor 203 is connected to a reverse voltage, and the contactor 203 is opened to disconnect the loop.

2. Second Execution Unit 206

The second execution unit 206 includes a first diode, a second diode, a third switch tube, a capacitor, a first switch, and a second switch. The first diode, the second diode, and the third diode are disposed for the function to prevent the device from being damaged by a reversed connection of the power supply. The capacitor is disposed for the following function. The capacitor is connected to the wiring terminals of the contactor 203 through the first switch and the second switch, a voltage is stored in the capacitor, when the first switch and the second switch are disconnected, the capacitor is not connected to the contactor 203, and when the first switch and the second switch are closed, the capacitor provides a reverse voltage for the wiring terminals of the contactor 203, thereby opening the contactor 203. The first switch and the second switch are disposed for the function to control a connection between the capacitor and the wiring terminals of the contactor 203.

Specifically, an anode of the first diode is connected to a positive electrode of a power supply of the contactor, and a cathode of the first diode is connected to a first terminal of the capacitor; an anode of the second diode is connected to a second terminal of the capacitor, and a cathode of the second diode is connected to a negative electrode of the power supply of the contactor; an anode of the third diode is connected to the second terminal of the capacitor, and a cathode of the third diode is connected to the protection unit; the first switch is connected between the first terminal of the capacitor and a negative wiring terminal of the contactor; and the second switch is connected between the second terminal of the capacitor and a positive wiring terminal of the contactor.

Figure 4:
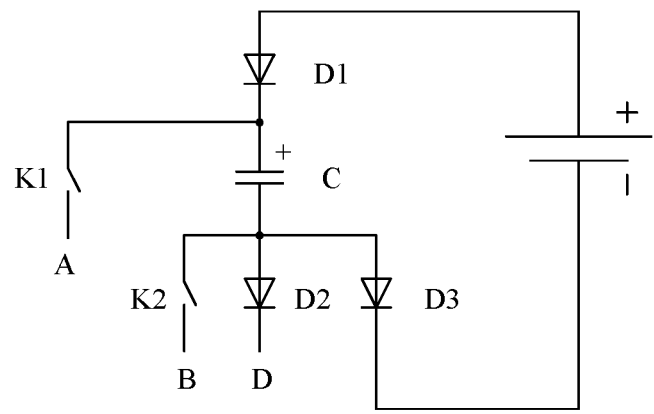
FIG. 4 is a schematic structural diagram of a second execution unit according to an embodiment of this application.

For ease of understanding, the following provides a specific example of a structure of the second execution unit 206. FIG. 4 is a schematic structural diagram of a second execution unit 206 according to an embodiment of this application. In FIG. 4, D1 may be considered as the first diode, D2 may be considered as the second diode, D3 may be considered as the third diode, K1 may be considered as the first switch, K2 may be considered as the second switch, and C may be considered as the capacitor. D is configured to connect to the protection unit 205 (a charging path is formed for the capacitor C through a connection to the protection unit).

When the contactor 203 is opened by using the first execution unit 204 shown in FIGS. 4, K1 and K2 are used as input ends of the second execution unit 206, a point D is connected to the protection unit 205, A and B are used as output ends of the second execution unit 206, and are respectively connected to the negative wiring terminal of the contactor 203 and the positive wiring terminal of the contactor 203; and when the protection unit 205 sends an opening instruction, K1 and K2 are closed, a positive electrode of C is connected to the negative wiring terminal of the contactor 203 through A, a negative electrode of C is connected to the positive wiring terminal of the contactor 203 through B, and the wiring terminals of the contactor 203 are connected to a reverse voltage, the contactor 203 is opened to disconnect the loop, thereby protecting safety of the loop.

Figure 5:
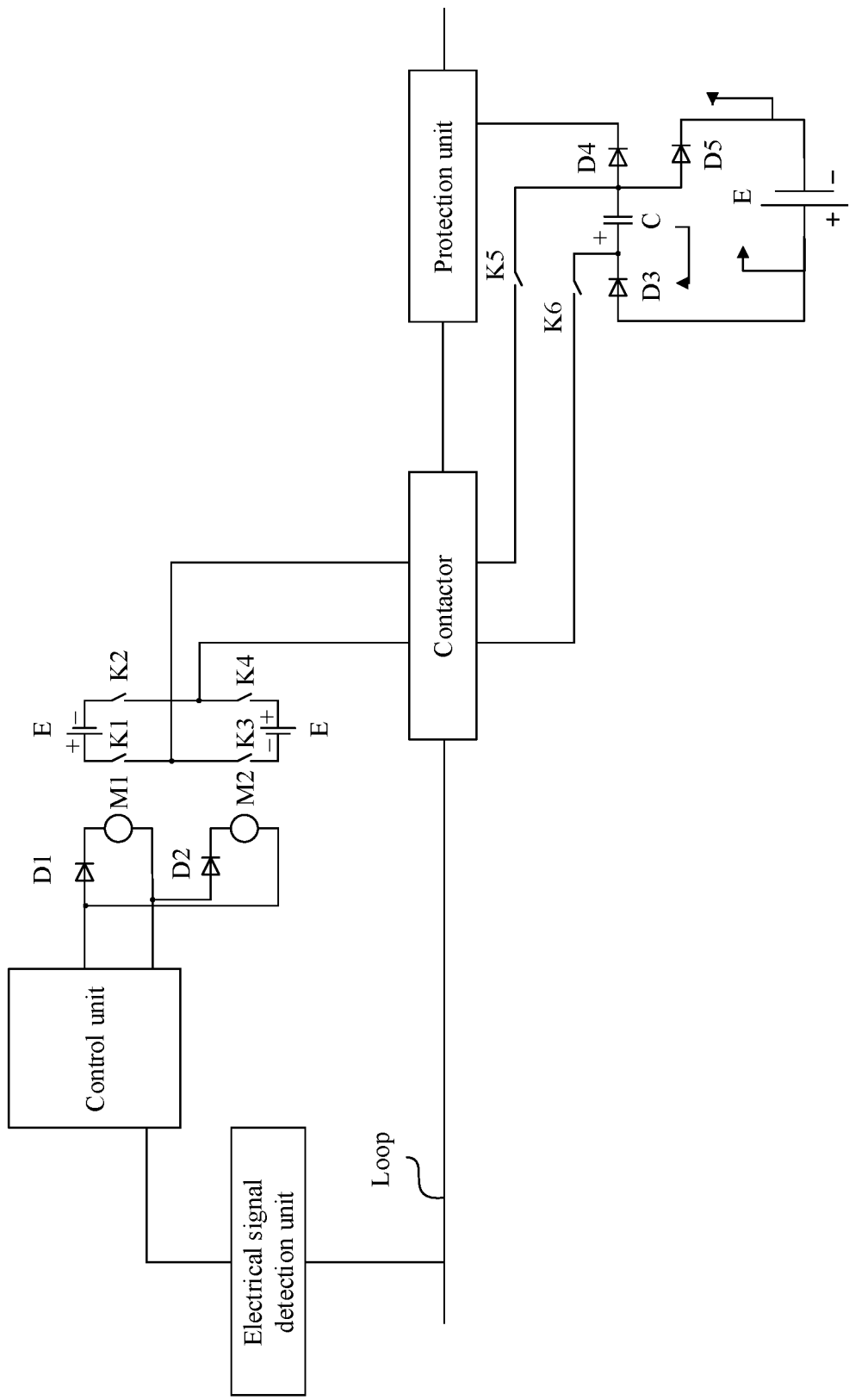
FIG. 5 is a second schematic structural diagram of a contactor control apparatus according to an embodiment of this application.

With reference to the foregoing description, for example, a specific schematic structural diagram of a contactor control apparatus provided in an embodiment of this application may be shown in FIG. 5. A first execution unit includes diodes D1 and D2, relay coils M1 and M2, main contacts K1 and K2 corresponding to M1, and main contacts K3 and K4 corresponding to M2. An anode of D1 is connected to both a control unit and a second terminal of M2. A cathode of D1 is connected to a first terminal of M1. An anode of D2 is connected to both the control unit and a second terminal of M1. A cathode of D2 is connected to a first terminal of M2. One terminal of K1 is connected to a positive electrode of a power supply E, and the other terminal of K1 is connected to a positive wiring terminal of a contactor. One terminal of K2 is connected to a negative electrode of the power supply E, and the other terminal of K2 is connected to a negative wiring terminal of the contactor. One terminal of K3 is connected to the negative electrode of the power supply E, and the other terminal of K3 is connected to the positive wiring terminal of the contactor. One terminal of K4 is connected to the positive electrode of the power supply E, and the other terminal of K4 is connected to the negative wiring terminal of the contactor.

A second execution unit includes diodes D3, D4, and D5, switches K5 and K6, and a capacitor C. An anode of D3 is connected to the positive electrode of E. A cathode of D3 is connected to a positive electrode of the capacitor C and one terminal of K6. An anode of D4 is connected to a negative electrode of the capacitor C and one terminal of K6. A cathode of D4 is connected to a protection unit. An anode of D5 is connected to the anode of D4. A cathode of D5 is connected to the negative electrode of the power supply E. The other terminal of K6 is connected to the negative wiring terminal of the contactor. The other terminal of K5 is connected to the positive wiring terminal of the contactor.

In the contactor control apparatus shown in FIG. 5, the first execution unit and the second execution unit are both connected to the contactor, the first execution unit opens the contactor based on a control signal, and the second execution unit opens the contactor according to an opening instruction. Specifically, when the loop is controlled or protected by using the control unit, the anodes of D1 and D2 are connected to the control unit, and the coil M1 or M2 is controlled to be conducted or cut off based on magnitudes of control signals. When the loop needs to be connected, the control unit sends a high-level signal to the anode of D1, and sends a low-level signal to the anode of D2. The two terminals of M1 receive a forward voltage, M1 is conducted, and K1 and K2 are closed. In this case, the positive electrode of the power supply E is connected to the positive wiring terminal of the contactor through the switch K1, and the negative electrode of the power supply E is connected to the negative wiring terminal of the contactor through the switch K1. The wiring terminals of the contactor are connected to a forward voltage. The contactor is closed to connect the loop. When the loop needs to be disconnected, the control unit sends a high-level signal to the anode of D2, and sends a low-level signal to the anode of D1. The two terminals of M2 receive a forward voltage, M2 is conducted, and K3 and K4 are closed. In this case, the positive electrode of the power supply E is connected to the negative wiring terminal of the contactor through K4, and the negative electrode of the power supply E is connected to the positive wiring terminal of the contactor through K3. The contactor is connected to a reverse voltage. The contactor is opened to disconnect the loop. When the loop is connected, the control unit receives a loop current value sent by an electrical signal detection unit, and when determining that a current on the loop exceeds a current fluctuation interval stored in the control unit, the control unit sends a high-level signal to the anode of D2, and sends a low-level signal to the anode of D1. The two terminals of M2 receive a forward voltage, M2 is conducted, and K3 and K4 are closed. In this case, the positive electrode of the power supply E is connected to the negative wiring terminal of the contactor through K4, and the negative electrode of the power supply E is connected to the positive wiring terminal of the contactor through K3.

The contactor is connected to a reverse voltage. The contactor is opened to disconnect the loop, thereby protecting the loop.

Specifically, when the loop is protected by using the protection unit, K5 and K6 are respectively connected to the positive wiring terminal and the negative wiring terminal of the contactor, and K5 and K6 are controlled to be closed according to an opening instruction of the protection unit. When the loop is connected, if the loop is faulty (a mainstream current reaches a trip threshold), the protection unit triggers the switches K4 and K5 to be closed. In this case, the positive electrode of the capacitor C is connected to the negative wiring terminal of the contactor, and the negative electrode of the capacitor C is connected to the positive wiring terminal of the contactor. The wiring terminals of the contactor are connected to a reverse voltage. The contactor is opened to disconnect the loop, thereby protecting the loop.

In conclusion, the contactor control apparatus 200 provided in this embodiment of this application is used. The protection unit and the control unit both can protect the loop, and in a process in which the protection unit protects the loop, the control unit is not required. Therefore, when the loop is protected by using the contactor control apparatus 200 provided in this embodiment of this application, if the control unit is faulty, safety of the loop may also be protected by using the protection unit, to implement double protection for the loop.

The contactor control apparatus 200 provided in this embodiment of this application is used. When the loop is disconnected and the control unit is faulty, to control the loop, a manual control unit is also disposed, to control the contactor to be opened or closed under an operation of a user, thereby controlling the loop to be connected or disconnected.

Specifically, the manual control unit may include a sixth diode, a seventh diode, a third switch, a fourth switch, a fifth switch, and a sixth switch. An anode of the sixth diode is connected to the positive electrode of the power supply of the contactor, and a cathode of the sixth diode is connected to both a first terminal of the third switch and a first terminal of the fifth switch. An anode of the seventh diode is connected to the negative electrode of the power supply of the contactor, and a cathode of the seventh diode is connected to both a first terminal of the fourth switch and a first terminal of the sixth switch. A second terminal of the third switch is connected to the positive wiring terminal of the contactor. A second terminal of the fourth switch is connected to the negative wiring terminal of the contactor. A second terminal of the fifth switch is connected to the negative wiring terminal of the contactor. A second terminal of the sixth switch is connected to the positive wiring terminal of the contactor. The third switch, the fourth switch, the fifth switch, or the sixth switch may be an inching switch; or the third switch and the fourth switch may constitute a first linked switch, and the fifth switch and the sixth switch may constitute a second linked switch.

During specific implementation, when the user manually operates the third switch and the fourth switch to be closed, the positive wiring terminal of the contactor is connected to the positive electrode of the power supply through the third switch and the sixth diode, and the negative wiring terminal of the contactor is connected to the negative electrode of the power supply through the fourth switch and the seventh diode. The contactor is connected to a forward voltage. The contactor is closed to connect the loop. When the user manually operates the fifth switch and the sixth switch to be closed, the positive wiring terminal of the contactor is connected to the negative electrode of the power supply through the sixth switch and the seventh diode, and the negative wiring terminal of the contactor is connected to the positive electrode of the power supply through the fifth switch and the sixth diode. The contactor is connected to a reverse voltage. The contactor is opened to disconnect the loop.

Figure 6:
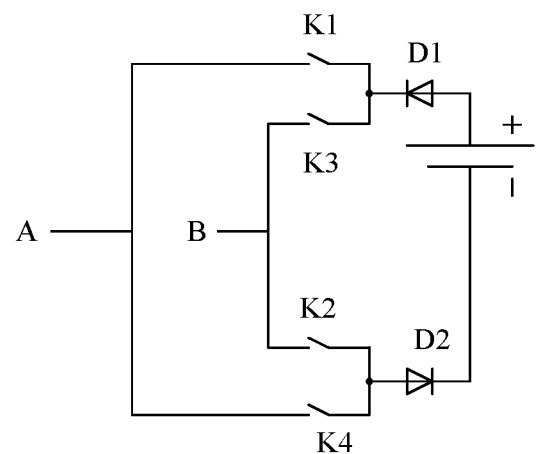
FIG. 6 is a schematic structural diagram of a manual control unit according to an embodiment of this application.

For ease of understanding, the following provides a specific example of a structure of the manual control unit. FIG. 6 is a schematic structural diagram of a manual control unit according to an embodiment of this application. In FIG. 6, K1 may be implemented as the third switch, K2 may be considered as the fourth switch, K3 may be considered as the fifth switch, K4 may be considered as the sixth switch, D1 may be considered as the seventh diode, and D2 may be considered as an eighth diode. A and B are used as output ends of the manual control unit, and are respectively connected to the positive wiring terminal and the negative wiring terminal of the contactor.

A process in which the contactor is closed by using the manual control unit shown in FIG. 6 is as follows: K1 and K2 are manually controlled to be closed, the positive electrode of the power supply is connected to the positive wiring terminal of the contactor through D1 and K1, the negative electrode of the power supply is connected to the negative wiring terminal of the contactor through D2 and K2, the contactor is connected to a forward voltage, and the contactor is closed to connect the loop.

A process in which the contactor is opened by using the manual control unit shown in FIG. 6 is as follows: K3 and K4 are manually controlled to be closed, the positive electrode of the power supply is connected to the negative wiring terminal of the contactor through D1 and K3, the negative electrode of the power supply is connected to the negative wiring terminal of the contactor through D2 and K4, the contactor is connected to a reverse voltage, and the contactor is opened to disconnect the loop.

Specifically, the devices in the contactor control apparatus 200 provided in this embodiment of this application may be connected in a form of an integrated circuit, or may be connected in forms of discrete devices.

Figure 7:
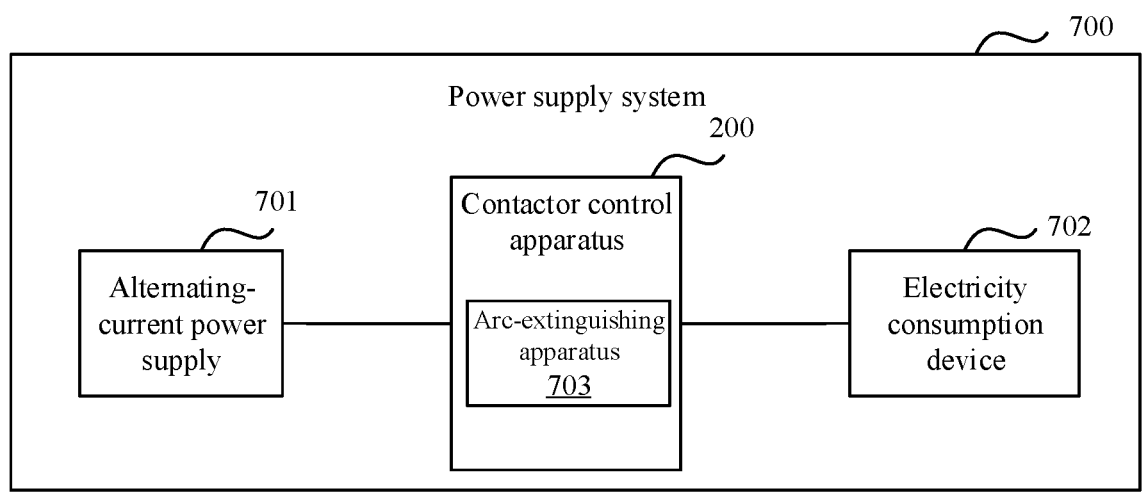
FIG. 7 is a schematic structural diagram of a power supply system according to an embodiment of this application.

Based on a same technical concept, the embodiments of this application further provide a power supply system. Referring to FIG. 7, the power supply system 700 includes the foregoing contactor control apparatus 200, an alternating-current power supply 701, and an electricity consumption device 702. The contactor control apparatus 200 is configured to control a connection between the alternating-current power supply 701 and the electricity consumption device 702.

A system structure and a service scenario provided in the embodiments of this application are mainly intended to explain some possible implementations of the technical solutions of this application, and should not be construed as a unique limitation on the technical solutions of this application. A person of ordinary skill in the art may know that, as a system evolves and an updated service scenario emerges, the technical solutions provided in this application are still applicable to a same or similar technical problem.

What is claimed is:

1. A control apparatus, comprising:
   an electrical signal detection circuit;
   a control circuit;
   a contactor circuit;
   a first execution circuit;
   a protection circuit; and
   a second execution circuit;

wherein the electrical signal detection circuit is configured to: detect an electrical signal on a loop, and send the electrical signal to the control circuit;

wherein the control circuit is configured to: generate a control signal based on the electrical signal received from the electrical signal detection circuit, and send the control signal to the first execution circuit;

wherein the contactor circuit is connected to the loop;

wherein the first execution circuit is configured to control the contactor circuit to be closed or opened based on the control signal received from the control circuit, wherein in response to the contactor circuit being closed, the loop is connected, and in response to the contactor circuit being opened, the loop is disconnected;

wherein the protection circuit is configured to: detect a current value on the loop in response to the contactor circuit being closed, and send an opening instruction to the second execution circuit in response to the current value reaching a trip threshold;

wherein the second execution circuit is configured to open the contactor circuit in response to receiving the opening instruction from the protection circuit;

wherein the second execution circuit comprises a first diode, a second diode, a third switch tube, a capacitor, a first switch, and a second switch;

wherein an anode of the first diode is connected to a positive electrode of a power supply of the contactor circuit, and a cathode of the first diode is connected to a first terminal of the capacitor;

wherein an anode of the second diode is connected to a second terminal of the capacitor, and a cathode of the second diode is connected to a negative electrode of the power supply of the contactor circuit;

wherein an anode of the third diode is connected to the second terminal of the capacitor, and a cathode of the third diode is connected to the protection circuit;

wherein the first switch is connected between the first terminal of the capacitor and a negative wiring terminal of the contactor circuit; and wherein the second switch is connected between the second terminal of the capacitor and a positive wiring terminal of the contactor circuit.

2. The control apparatus according to claim 1, wherein:
the protection circuit comprises an overload protection circuit and a short circuit protection circuit;
the overload protection circuit is connected to the loop, and is configured to: detect the current value on the loop in response to the contactor circuit being closed, and trigger the first switch and the second switch to be closed in response to the current value reaching a first trip threshold;
the short circuit protection circuit is connected to the loop, and is configured to: detect the current value on the loop in response to the contactor circuit being closed, and trigger the first switch and the second switch to be closed in response to the current value reaching a second trip threshold; and
the first trip threshold is less than the second trip threshold.

3. The control apparatus according to claim 2, wherein the overload protection circuit comprises a thermal tripper, and the short circuit protection circuit comprises an instantaneous tripper.

4. The control apparatus according to claim 1, wherein:
the first execution circuit comprises a fourth diode, a fifth diode, a first relay, and a second relay;

an anode of the fourth diode is connected to the control circuit and a negative wiring terminal of the second relay, and a cathode of the fourth diode is connected to a positive wiring terminal of the first relay;

an anode of the fifth diode is connected to the control circuit and a negative wiring terminal of the first relay, and a cathode of the fifth diode is connected to a positive wiring terminal of the second relay;

a first terminal of a first main contact of the first relay is connected to the positive electrode of the power supply of the contactor circuit, and a second terminal of the first main contact of the first relay is connected to the positive wiring terminal of the contactor circuit;

a first terminal of a second main contact of the first relay is connected to a first terminal of a second main contact of the second relay, and a second terminal of the second main contact of the first relay is connected to the negative wiring terminal of the contactor circuit and the negative electrode of the power supply of the contactor circuit;

a first terminal of a first main contact of the second relay is connected to the positive electrode of the power supply of the contactor circuit, and a second terminal of the first main contact of the second relay is connected to the negative wiring terminal of the contactor circuit; and a second terminal of the second main contact of the second relay is connected to both the positive wiring terminal of the contactor circuit and the negative electrode of the power supply of the contactor circuit.

5. The control apparatus according to claim 1, further comprising:
a manual control circuit, configured to control the contactor circuit to be opened or closed under operation of a user.

6. The control apparatus according to claim 5, wherein:
the manual control circuit comprises a sixth diode, a seventh diode, a third switch, a fourth switch, a fifth switch, and a sixth switch;
an anode of the sixth diode is connected to the positive electrode of the power supply of the contactor circuit, and a cathode of the sixth diode is connected to both a first terminal of the third switch and a first terminal of the fifth switch;
an anode of the seventh diode is connected to the negative electrode of the power supply of the contactor circuit, and a cathode of the seventh diode is connected to both a first terminal of the fourth switch and a first terminal of the sixth switch;
a second terminal of the third switch is connected to the positive wiring terminal of the contactor circuit;
a second terminal of the fourth switch is connected to the negative wiring terminal of the contactor circuit;
a second terminal of the fifth switch is connected to the negative wiring terminal of the contactor circuit; and
a second terminal of the sixth switch is connected to the positive wiring terminal of the contactor circuit.

7. The control apparatus according to claim 6, wherein:
one or more of the third switch, the fourth switch, the fifth switch, or the sixth switch is an inching switch.

8. The control apparatus according to claim 6, wherein:
one or more of the third switch and the fourth switch comprise a first linked switch; and
each of the fifth switch and the sixth switch comprise a second linked switch.

9. The control apparatus according to claim 1, wherein the electrical signal detection circuit is any one or more of the following:
- a Hall effect sensor, a magnetic sensor, a giant magneto resistive (GMR) magnetic field sensor, a tunnel magneto resistive (TMR) sensor, a magneto resistive (AMR) sensor, or a current divider.

10. The control apparatus according to claim 1, further comprising:
- an arc-extinguishing circuit, configured to extinguish an electric arc generated in response to a status of the contactor circuit changing, wherein that a status of the contactor circuit changes comprises that the contactor circuit changes from a closing state to an opening state or changes from the opening state to the closing state.

* * * * *